(12) United States Patent
Marlow et al.

(10) Patent No.: US 11,362,016 B2
(45) Date of Patent: Jun. 14, 2022

(54) TRANSAXLE WITH SEMICONDUCTOR DEVICE COOLING ARRANGEMENT

(71) Applicant: Ford Global Technologies, LLC, Dearborn, MI (US)

(72) Inventors: Richard Marlow, Grimsby (CA); Craig Rogers, Belleville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 1059 days.

(21) Appl. No.: 15/968,781

(22) Filed: May 2, 2018

(65) Prior Publication Data

US 2019/0341334 A1 Nov. 7, 2019

(51) Int. Cl.
*H01L 23/473* (2006.01)
*F16H 57/04* (2010.01)
*H02P 29/68* (2016.01)
*B60K 6/365* (2007.10)
*H02P 27/06* (2006.01)
*H02M 7/537* (2006.01)

(52) U.S. Cl.
CPC ....... *H01L 23/473* (2013.01); *F16H 57/0476* (2013.01); *H02P 29/68* (2016.02); *B60K 6/365* (2013.01); *B60Y 2200/91* (2013.01); *B60Y 2200/92* (2013.01); *H02M 7/537* (2013.01); *H02P 27/06* (2013.01); *Y10S 903/91* (2013.01)

(58) Field of Classification Search
CPC .... H01L 23/473; H02P 29/68; F16H 57/0476; B60K 6/365
USPC ....................................................... 307/10.1
See application file for complete search history.

(56) References Cited

U.S. PATENT DOCUMENTS

| | | | |
|---|---|---|---|
| 6,323,613 B1 * | 11/2001 | Hara | B60L 15/20 |
| | | | 318/471 |
| 6,621,701 B2 | 9/2003 | Tamba et al. | |
| 7,210,304 B2 * | 5/2007 | Nagashima | F28D 15/00 |
| | | | 62/259.2 |
| 7,307,841 B2 | 12/2007 | Berlin et al. | |
| 7,963,353 B2 | 6/2011 | Tatematsu et al. | |
| 9,190,896 B2 | 11/2015 | Chen et al. | |
| 2007/0230127 A1 | 10/2007 | Peugh et al. | |
| 2009/0000577 A1 * | 1/2009 | Miyagawa | F28D 15/06 |
| | | | 123/41.2 |

(Continued)

OTHER PUBLICATIONS

Sarvey, Thomas E., et al. Embedded Cooling Technologies For Densely Integrated Electronic Systems, School of Electrical and Computer Engineering, Georgia Institute of Technology, and Altera Corporation, Custom Integrated Circuits Conference (CICC), 2015 IEEE. Date added to IEEE Xplore: Nov. 30, 2015.

(Continued)

*Primary Examiner* — Alfonso Perez Borroto
(74) *Attorney, Agent, or Firm* — David B. Kelley; Carlson, Gaskey & Olds, P.C.

(57) ABSTRACT

This disclosure relates to a motor vehicle including a transaxle with a cooling arrangement for semiconductor devices such as IGBTs or MOSFETs, and a corresponding method. In particular, this disclosure relates to a motor vehicle, such as an electrified vehicle, including a transaxle, a plurality of semiconductor devices mounted adjacent the transaxle, and a source of cooling fluid. The semiconductor devices are exposed to fluid from the source that flows into the transaxle.

15 Claims, 3 Drawing Sheets

(56) References Cited

U.S. PATENT DOCUMENTS

| | | | | |
|---|---|---|---|---|
| 2010/0139998 A1* | 6/2010 | Schondorf | ............... | B60K 6/40 |
| | | | | 903/910 |
| 2010/0179009 A1* | 7/2010 | Wittkopp | ............... | B60K 6/547 |
| | | | | 475/5 |
| 2013/0324340 A1* | 12/2013 | Holmes | ................ | B60K 6/445 |
| | | | | 475/5 |
| 2014/0054986 A1* | 2/2014 | Hirai | .................... | H02P 29/662 |
| | | | | 310/53 |
| 2018/0058557 A1* | 3/2018 | Janson | .................. | B60K 6/445 |
| 2018/0080542 A1* | 3/2018 | Sugiyama | ................ | B60K 6/40 |
| 2018/0201114 A1* | 7/2018 | Oh | ........................ | B60K 6/365 |
| 2019/0161072 A1* | 5/2019 | Li | .......................... | B60K 6/547 |

OTHER PUBLICATIONS

Toon, John. Liquid Cooling Moves onto the Chip for Denser Electronics, Retrieved from: http://www.rh.gatech.edu/news/455491/liquid-cooling-moves-chip-denser-electronics, Posted Oct. 5, 2015, Atlanta, GA.

* cited by examiner

TRANSAXLE WITH SEMICONDUCTOR DEVICE COOLING ARRANGEMENT

TECHNICAL FIELD

This disclosure relates to a motor vehicle including a transaxle with a cooling arrangement for semiconductor devices, such as insulated-gate bipolar transistors (IGBTs) or MOSFETs, and a corresponding method.

BACKGROUND

The need to reduce automotive fuel consumption and emissions is well known. Therefore, vehicles are being developed that reduce reliance on internal combustion engines. Electrified vehicles are one type of vehicle being developed for this purpose. In general, electrified vehicles differ from conventional motor vehicles in that electrified vehicles are selectively driven using one or more electric machines powered by a first power supply, namely a traction battery (i.e., a battery pack). The electric machines can drive the electrified vehicles instead of, or in addition to, a second power supply, such as an internal combustion engine. Example electrified vehicles include hybrid electric vehicles (HEVs), plug-in hybrid electric vehicles (PHEVs), fuel cell vehicles (FCVs), and battery electric vehicles (BEVs).

Electrified vehicles are known to include inverters, which are electronic devices configured to change direct current (DC) to alternating current (AC). Such inverters typically include a plurality semiconductor devices, such as MOSFETs and/or insulated-gate bipolar transistors (IGBTs). Inverters may be electrically coupled between the traction battery and the electric machine.

SUMMARY

A motor vehicle according to an exemplary aspect of the present disclosure includes, among other things, a transaxle, a plurality of semiconductor devices mounted adjacent the transaxle, and a source of cooling fluid. The semiconductor devices are exposed to fluid from the source that flows into the transaxle.

In a further non-limiting embodiment of the foregoing motor vehicle, the semiconductor devices are one of insulated-gate bipolar transistors (IGBTs) and MOSFETs.

In a further non-limiting embodiment of any of the foregoing motor vehicles, the semiconductor devices are mounted on an outer side of an outer wall of the transaxle and are either directly exposed to fluid from the source that ultimately flows into the transaxle or are indirectly exposed to the fluid.

In a further non-limiting embodiment of any of the foregoing motor vehicles, the semiconductor devices are arranged within the transaxle and are directly exposed to fluid from the source that flows into the transaxle.

In a further non-limiting embodiment of any of the foregoing motor vehicles, the transaxle includes an outer wall, and the semiconductor devices are supported by a frame having a length substantially parallel to the outer wall.

In a further non-limiting embodiment of any of the foregoing motor vehicles, the semiconductor devices are spaced-apart from the outer wall such that fluid is allowed to flow between the semiconductor devices and the outer wall.

In a further non-limiting embodiment of any of the foregoing motor vehicles, the semiconductor devices are spaced-apart from one another such that fluid is allowed to flow between the semiconductor devices.

In a further non-limiting embodiment of any of the foregoing motor vehicles, the outer wall includes a plurality of orifices configured to direct fluid to flow in a direction substantially parallel to a height of the frame.

In a further non-limiting embodiment of any of the foregoing motor vehicles, the transaxle includes a plenum adjacent the orifices, the plenum mounted to the outer wall on an opposite side of the semiconductor devices.

In a further non-limiting embodiment of any of the foregoing motor vehicles, the transaxle is configured to direct fluid to flow in one of (1) a direction substantially parallel to a length of the frame and (2) a direction substantially parallel to a width of the frame.

In a further non-limiting embodiment of any of the foregoing motor vehicles, one of (1) the frame and (2) the semiconductor devices includes channels extending parallel to a direction of the flow of fluid.

In a further non-limiting embodiment of any of the foregoing motor vehicles, the channels are formed in an exterior surface of the semiconductor devices.

In a further non-limiting embodiment of any of the foregoing motor vehicles, the channels are formed interiorly of the semiconductor devices.

In a further non-limiting embodiment of any of the foregoing motor vehicles, the channels are formed in a surface of the frame facing the semiconductor devices.

In a further non-limiting embodiment of any of the foregoing motor vehicles, the source includes a transmission fluid cooler.

In a further non-limiting embodiment of any of the foregoing motor vehicles, the fluid is automatic transmission fluid (ATF).

In a further non-limiting embodiment of any of the foregoing motor vehicles, the vehicle includes an inverter configured to change direct current (DC) to alternating current (AC), the inverter includes the semiconductor devices, the vehicle is an electrified vehicle including a battery pack and a motor, and wherein the inverter is electrically coupled between the battery pack and the motor.

A method according to an exemplary aspect of the present disclosure includes, among other things, cooling semiconductor devices mounted adjacent a transaxle by exposing the semiconductor devices to cooling fluid of the transaxle.

In a further non-limiting embodiment of the foregoing method, the semiconductor devices are mounted to a frame such that the semiconductor devices are spaced-apart from one another, and the cooling step includes directing cooling fluid between the semiconductor devices.

In a further non-limiting embodiment of any of the foregoing methods, the semiconductor devices are mounted to a frame, and the cooling step includes directing cooling fluid over the semiconductor devices in a direction substantially parallel to one of (1) a length of the frame, (2) a width of the frame, and (3) a height of the frame.

DETAILED DESCRIPTION

This disclosure relates to a motor vehicle including a transaxle with a cooling arrangement for semiconductor devices, such as insulated-gate bipolar transistors (IGBTs) or MOSFETs, and a corresponding method. In particular, this disclosure relates to a motor vehicle, such as an electrified vehicle, including a transaxle, a plurality of semiconductor devices mounted adjacent the transaxle, and a source of cooling fluid. The semiconductor devices are exposed to fluid from the source that flows into the transaxle. By cooling the semiconductor devices with the cooling fluid of the transaxle, such as automatic transmission fluid (ATF), there is no need a for a separate cooling loop dedicated to the semiconductor devices, which has a number of benefits, and in particular leads to reduced cost, a reduction in parts, increased ease of assembly, etc. These and other benefits will be appreciated from the below description.

Figure 1:
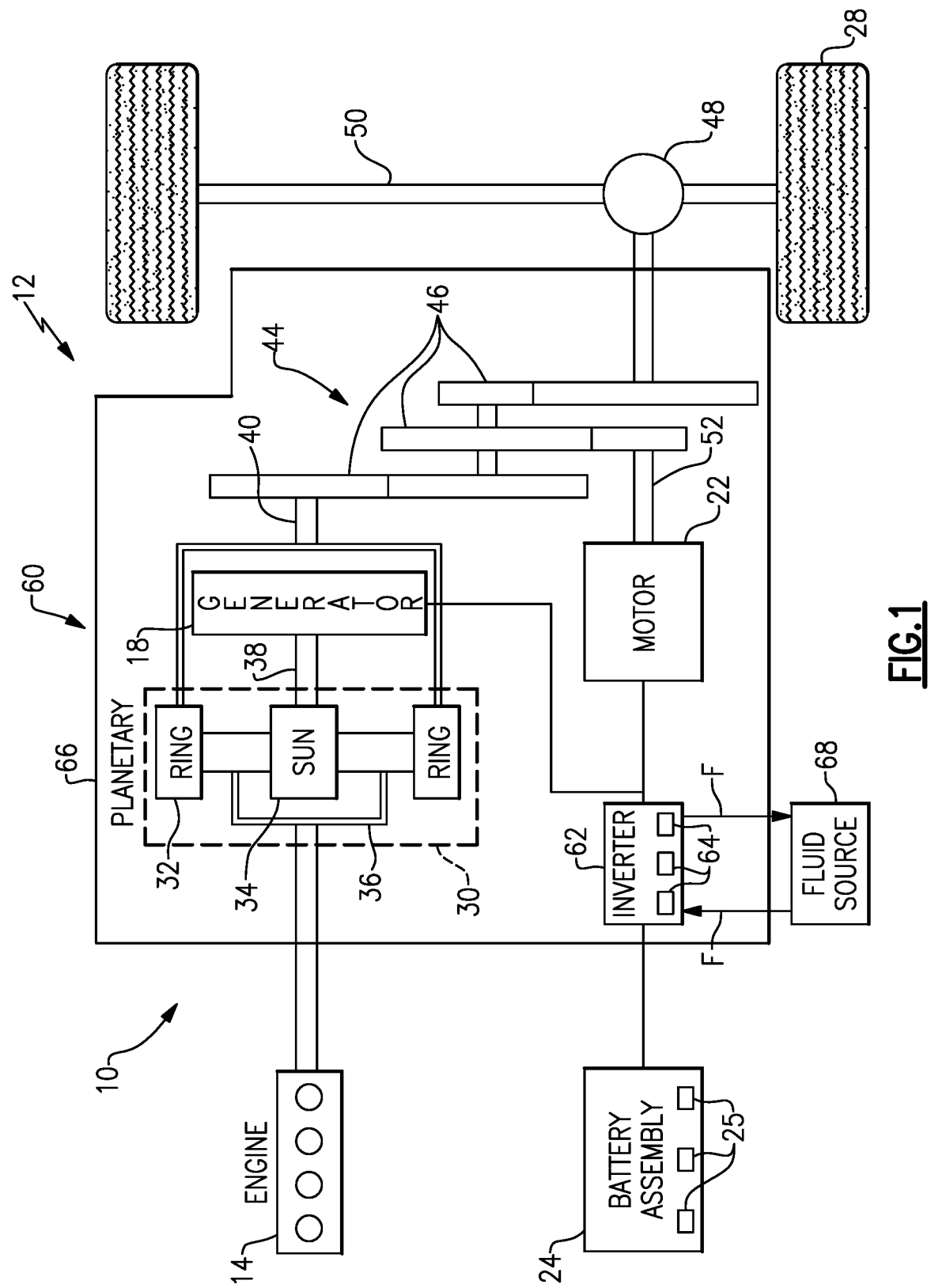
FIG. 1 schematically illustrates a powertrain of an electrified vehicle.

Referring to the drawings, FIG. 1 schematically illustrates a powertrain 10 for a motor vehicle, which in this example is an electrified vehicle 12. Although depicted as a hybrid electric vehicle (HEV), it should be understood that the concepts described herein are not limited to HEVs and could extend to other electrified vehicles, including, but not limited to, plug-in hybrid electric vehicles (PHEVs) and battery electric vehicles (BEVs). This disclosure also extends to conventional motor vehicles which rely exclusively on internal combustion engines.

In a non-limiting embodiment, the powertrain 10 is a power-split powertrain system that employs a first drive system and a second drive system. The first drive system includes a combination of an engine 14 and a generator 18 (i.e., a first electric machine). The second drive system includes at least a motor 22 (i.e., a second electric machine), the generator 18, and a battery pack 24. In this example, the second drive system is considered an electric drive system of the powertrain 10. The first and second drive systems generate torque to drive one or more sets of vehicle drive wheels 28 of the electrified vehicle 12. Although a power-split configuration is depicted in FIG. 1, this disclosure extends to any hybrid or electric vehicle including full hybrids, parallel hybrids, series hybrids, mild hybrids, micro hybrids, plug-in hybrids, and battery electric vehicles. This disclosure also extends to motor vehicles that are not electrified vehicles, including motor vehicles having only an internal combustion engine.

The engine 14, which in one embodiment is an internal combustion engine, and the generator 18 may be connected through a power transfer unit 30, such as a planetary gear set. Of course, other types of power transfer units, including other gear sets and transmissions, may be used to connect the engine 14 to the generator 18. In one non-limiting embodiment, the power transfer unit 30 is a planetary gear set that includes a ring gear 32, a sun gear 34, and a carrier assembly 36.

The generator 18 can be driven by the engine 14 through the power transfer unit 30 to convert kinetic energy to electrical energy. The generator 18 can alternatively function as a motor to convert electrical energy into kinetic energy, thereby outputting torque to a shaft 38 connected to the power transfer unit 30. Because the generator 18 is operatively connected to the engine 14, the speed of the engine 14 can be controlled by the generator 18.

The ring gear 32 of the power transfer unit 30 may be connected to a shaft 40, which is connected to vehicle drive wheels 28 through a second power transfer unit 44. The second power transfer unit 44 may include a gear set having a plurality of gears 46. Other power transfer units may also be suitable. The gears 46 transfer torque from the engine 14 to a differential 48 to ultimately provide traction to the vehicle drive wheels 28. The differential 48 may include a plurality of gears that enable the transfer of torque to the vehicle drive wheels 28. In one embodiment, the second power transfer unit 44 is mechanically coupled to an axle 50 through the differential 48 to distribute torque to the vehicle drive wheels 28.

The motor 22 can also be employed to drive the vehicle drive wheels 28 by outputting torque to a shaft 52 that is also connected to the second power transfer unit 44. In one embodiment, the motor 22 and the generator 18 cooperate as part of a regenerative braking system in which both the motor 22 and the generator 18 can be employed as motors to output torque. In another example, the motor 22 and the generator 18 can each output electrical power to the battery pack 24.

The battery pack 24 is an exemplary electrified vehicle battery. The battery pack 24 may be a high voltage traction battery pack that includes a plurality of battery assemblies 25 (i.e., battery arrays or groupings of battery cells) capable of outputting electrical power to operate the motor 22, the generator 18 and/or other electrical loads of the electrified vehicle 12 via an electrical distribution system. Other types of energy storage devices and/or output devices could also be used to electrically power the electrified vehicle 12.

In a non-limiting embodiment, the electrified vehicle 12 has two basic operating modes. The electrified vehicle 12 may operate in an Electric Vehicle (EV) mode where the motor 22 is used (generally without assistance from the engine 14) for vehicle propulsion, thereby depleting the battery pack 24 state of charge up to its maximum allowable discharging rate under certain driving patterns/cycles. The EV mode is an example of a charge depleting mode of operation for the electrified vehicle 12. During EV mode, the state of charge of the battery pack 24 may increase in some circumstances, for example due to a period of regenerative braking. The engine 14 is generally OFF under a default EV mode but could be operated as necessary based on a vehicle system state or as permitted by the operator.

The electrified vehicle 12 may additionally operate in a Hybrid (HEV) mode in which the engine 14 and the motor 22 are both used for vehicle propulsion. The HEV mode is an example of a charge sustaining mode of operation for the electrified vehicle 12. During the HEV mode, the electrified vehicle 12 may reduce the motor 22 propulsion usage in order to maintain the state of charge of the battery pack 24 at a constant or approximately constant level by increasing the engine 14 propulsion. The electrified vehicle 12 may be operated in other operating modes in addition to the EV and HEV modes within the scope of this disclosure.

In this example, the electrified vehicle 12 also includes a transaxle 60. The transaxle 60 is shown schematically in FIG. 1. The term transaxle is used in this disclosure consistent with its ordinary meaning, which is used in the automotive art field to refer to a mechanical component that combines the functionality of one or more of a transmission, axle, and differential into one integrated assembly. For instance, in the example of in FIG. 1, the transaxle 60 includes the motor 22, the first power transfer unit 30, and the second power transfer unit 44, among other components. The transaxle 60 may include additional or fewer components than those illustrated in FIG. 1. The transaxle 60 further includes an inverter 62, which is an electronic device configured to change direct current (DC) to alternating current (AC). The inverter 62 includes a plurality of IGBTs 64, which are semiconductor devices used as electronic switches. While IGBTs 64 are shown in the figures and described below, this disclosure extends to other semiconductor devices, including MOSFETs, and in particular including GaN or SiC MOSFETs. The inverter 62 is electrically coupled between the battery pack 24 and the motor 22, and is configured to change DC from the battery pack to AC.

It should be understood that this disclosure extends to transaxles that include other components. This disclosure also extends to inverters 62 that are located elsewhere in the electrified vehicle 12, and that are electrically coupled to other components. Further, it should be understood that this disclosure extends to IGBTs and other semiconductor devices that are used in devices other than inverters.

The IGBTs 64 are mounted within the transaxle 60, in this example. Specifically, the transaxle 60 includes an outer wall 66, which serves as an outer case for the transaxle 60 in one example, and the IGBTs 64 are mounted within the outer wall 66. Further, while the inverter 62 is entirely within the transaxle 60 in FIG. 1, it should be understood that various parts of the inverter 62 may be located outside the transaxle 60. For instance, the IGBTs 64 may be mounted within the transaxle 60, as shown, but the remainder of the inverter 62 may be mounted to an exterior of the transaxle 60.

With the IGBTs 64 mounted within the transaxle 60, the IGBTs 64 can be cooled with the cooling fluid of the transaxle 60, which may be automatic transmission fluid (ATF). While ATF is one example, the term cooling fluid refers to all types of coolant or refrigerant. FIG. 1 schematically illustrates a source 68 of cooling fluid F (hereinafter "fluid F"). The source 68 may include a transmission oil cooler and a pump, among other components. While shown outside the transaxle 60, the source 68 may be provided at least partially within the transaxle 60, or may be mounted to the transaxle 60, as examples. The fluid F may be provided by any known type of cooling fluid, including ATF.

Advancements in semiconductor technology has made it possible to achieve adequate cooling of IGBTs and MOSFETs, for example, using fluids operating at temperatures typical of transaxle cooling fluid, such as ATF. In particular, recent generations of IGBTs have an increased operating temperature, whereas previous IGBTs could not be adequately cooled using ATF. Cooling the IGBTs 64 with ATF improves upon prior arrangements, in which IGBTs were cooled using a dedicated cooling loop, which included a cold plate, hoses/tubes, a radiator and a pump. The present disclosure reduces or completely eliminates the need for these structures.

In order to achieve adequate cooling using ATF in particular, as well as other fluids, this disclosure contemplates a number of IGBT mounting arrangements, which will now be described. In each of the disclosed arrangements, however, the IGBTs 64 are arranged within the transaxle 60 such that the IGBTs 64 are directly exposed to fluid F from the source 68 that flows into the transaxle 60. In this way, increased heat transfer is achieved.

Figure 2:
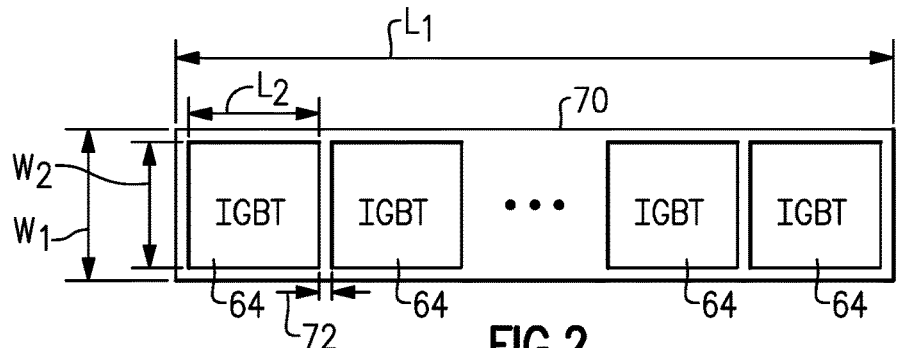
FIG. 2 illustrates an arrangement of a frame supporting a plurality of IGBTs.

FIG. 2 illustrates an example frame 70, which is configured to support a plurality of IGBTs 64. FIG. 2 specifically shows two IGBTs 64 at each end of the frame, with an ellipsis in the middle representing a plurality of additional IGBTs 64. It should be understood that this disclosure extends to frames that support any number of IGBTs. It should also be understood that this disclosure extends to frames that support IGBTs or other semiconductor devices in other ways.

Figure 3:
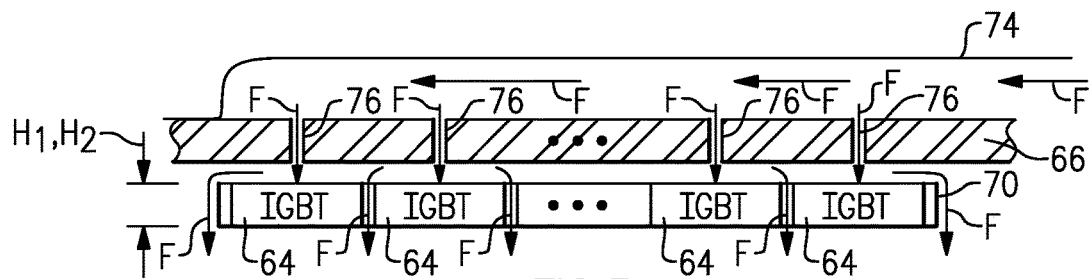
FIG. 3 illustrates a first example arrangement of the frame and IGBTs within the transaxle.

The frame 70 is illustrated schematically in FIG. 2. The frame 70 may be made of a metallic material or a plastic material, as examples. The frame 70 is configured to support the IGBTs 64 relative to the transaxle 60, and in particular relative to the outer wall 66 of the transaxle 60, as shown in FIG. 3. While not shown in the figures, the frame 70 may include posts, tabs, or flanges for attachment to the IGBTs 64. The IGBTs 64 may be coupled to the frame 70 in other ways, however. Further, while not shown in FIG. 3, the frame 70 may be attached to the outer wall 66 using a known attachment technique, such as using fasteners or welding, as examples.

The frame 70, in this example, has a length $L_1$, a width $W_1$, and a height $H_1$ (FIG. 3). The IGBTs 64, which have a length $L_2$, a width $W_2$, and a height $H_2$ (FIG. 3), are supported on the frame 70 such that the lengths $L_2$ of the IGBTs 64 are parallel to the length $L_1$ of the frame 70, and such that the widths of the IGBTs 64 are parallel to the width $W_1$ of the frame 70. While the IGBTs 64 and frame 70 are rectangular in shape in this example, this disclosure extends to other shapes for the IGBTs and frame.

In this example, the length $L_1$ is substantially larger than the length $L_2$ of the individual IGBTs 64 such that a plurality of IGBTs 64 may fit within the frame 70. The width $W_1$ is slightly larger than the width $W_2$, and the height $H_1$ of the frame 70 may be substantially equal to the height $H_2$ of the IGBTs. The height $H_1$ may be larger than the height $H_2$, however.

The IGBTs 64 are each spaced-apart from one another in the direction of the length $L_1$ of the frame 70. An example spacing is shown at 72 in FIG. 2. It should be understood that each of the IGBTs 64 may be spaced-apart from one another by the same amount. The IGBTs 64 may also be spaced-apart from the frame 70 in the width and height directions $W_1$, $H_1$ by this same spacing 72 or by another amount of space. The spacing 72 allows fluid F to flow around and between the IGBTs 64, which increases heat transfer.

FIG. 3 illustrates an example arrangement of the IGBTs 64 and the frame 70 within the transaxle 60. While only one frame is shown in FIG. 3, it should be understood that additional frames may be arranged within the transaxle 60. The frame 70 is mounted such that its length $L_1$ extends substantially parallel to the outer wall 66. As such, the width $W_1$ of the frame 70 is also substantially parallel to the outer wall 66, whereas the height $H_1$ of the frame 70 is substantially perpendicular to the outer wall 66. In the example of FIG. 3, the frame 70 and the IGBTs 64 are spaced-apart from the outer wall 66 by an amount, which may be equal to the spacing 72 or another amount, to allow fluid to flow to the IGBTs 64.

In this example, the transaxle 60 includes a plenum 74 mounted on an outer surface of the outer wall 66. This disclosure extends to configurations that do not include plenums, however. The plenum 74 is fluidly coupled to the source 68 of fluid F. In particular, the plenum 74 may be fluidly coupled immediately downstream of the source 68, such that the fluid F flows to the IGBTs 64 before any other component of the transaxle. In this way, the fluid F is at its coolest as it interacts with the IGBTs, which increases the efficiency of cooling the IGBTs 64. The temperature of the fluid F as it enters the plenum 74 may be about 90° C. in one example.

Further, in this embodiment, the outer wall 66 includes a plurality of orifices 76 configured to direct the fluid F such that it flows in a direction substantially parallel to a height $H_1$ of the frame 70. The orifices 76 are also aligned such that they direct the fluid F directly onto the IGBTs 64, which causes the fluid F to collide with a relatively large surface area of the IGBTs 64. This creates an impingement cooling effect. This disclosure extends to orifices 76 that are arranged in other ways.

In the example of FIG. 3, after fluid F is directed through the orifices 76, it collides with the IGBTs 64, which spreads the fluid F outwardly, causing the fluid F to flow between the IGBTs 64 and around the end of the frame 70. The fluid F is directly exposed to the IGBTs 64 and absorbs heat from the IGBTs 64, thereby cooling the IGBTs 64. After passing downstream of the IGBTs 64, the fluid F may flow to a downstream location, which may be a location within the transaxle 60, for example.

Figure 4:
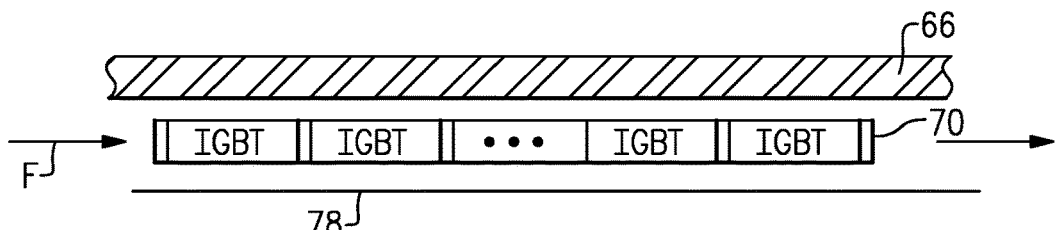
FIG. 4 illustrates a second example arrangement of the frame and IGBTs within the transaxle.

FIG. 4 illustrates another cooling arrangement. In particular, in FIG. 4, the transaxle 60 is configured to direct fluid F in a direction substantially parallel to a length $L_1$ of the frame 70. In particular, in FIG. 4, the fluid F is directed adjacent the frame 70, within a flow path bounded by the outer wall 66 and a separator wall 78, which extends substantially parallel to the outer wall 66. As fluid F flows parallel to the length $L_1$ of the frame 70, fluid F absorbs heat from the IGBTs 64. Fluid F may also flow between the IGBTs 64, as in the above example. Alternatively, the transaxle 60 may also be arranged such that the fluid F flows in a direction substantially parallel to the width $W_1$ of the frame 70, as in the example of FIG. 7, which is discussed below.

Figure 5:
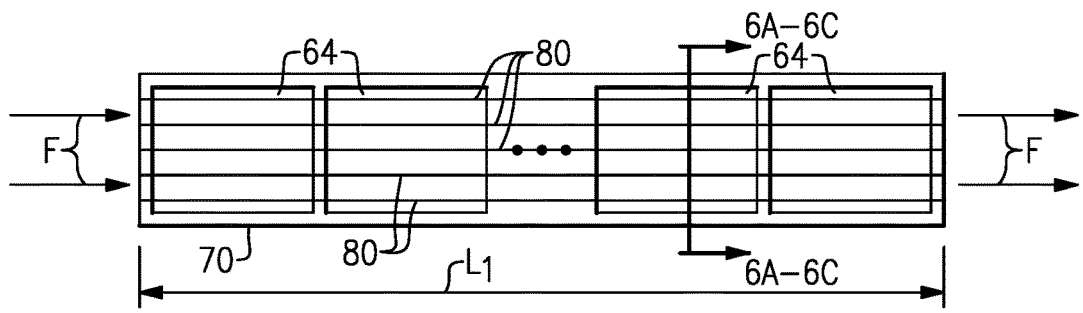
FIG. 5 schematically illustrates a plurality of channels extending in a direction parallel to a length of the frame.
Figures 6A, 6B, 6C:
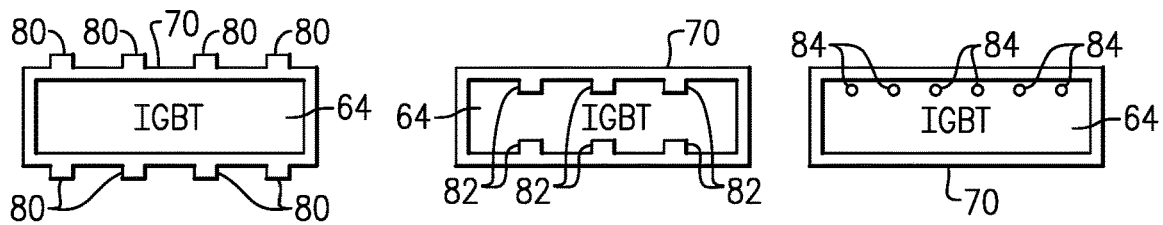
FIG. 6A is a cross-sectional view taken along line 6A-6C-6A-6C from FIG. 5, and illustrates an example in which channels are formed in the frame.
FIG. 6B is a cross-sectional view taken along line 6A-6C-6A-6C from FIG. 5, and illustrates an example in which channels are formed in outer surfaces of the IGBTs.
FIG. 6C is a cross-sectional view taken along line 6A-6C-6A-6C from FIG. 5, and illustrates an example in which channels are formed interiorly of the IGBTs.

In order to better-direct the flow of fluid F, either the IGBTs 64 or the frame 70 may include channels extending parallel to a direction of the flow of fluid F. FIG. 5 is a somewhat schematic view of the flow arrangement of FIG. 4. FIGS. 6A-6C are cross-sectional views taken along line 6A-6C-6A-6C from FIG. 5, and illustrate example channel configurations.

FIG. 6A, for example, illustrates an arrangement wherein the frame 70 includes a plurality of channels 80, which are essentially grooves formed in the frame 70. The channels 80 are illustrated schematically in FIG. 5. The channels 80 extend along the entire length $L_1$ of the frame 70 and are substantially parallel to one another. Further, in this example, the channels 80 are formed on opposite sides of the frame 70. In particular, the channels 80 are formed in the frame 70 adjacent the top and bottom surfaces of the IGBTs 64 (relative to the orientation of the IGBTs 64 in the figures).

In FIG. 6B, channels 82 are formed in the exterior surfaces of the IGBTs 64 themselves rather than in the frame 70. In particular, the channels 82 are formed in opposing top and bottom surfaces of the IGBTs 64 (again, "top" and "bottom" are used with reference to the orientation of the IGBTs 64 in the figures). In either example, the channels 80, 82 facilitate the flow of fluid F relative to the frame 70.

In FIG. 6C, the IGBTs may include channels 84 located interiorly of the IGBTs 64. That is, the structure of the IGBTs encloses the channels 84. The ends of the channels are open, to allow the fluid F to enter and exit the channels 84.

Figure 7:
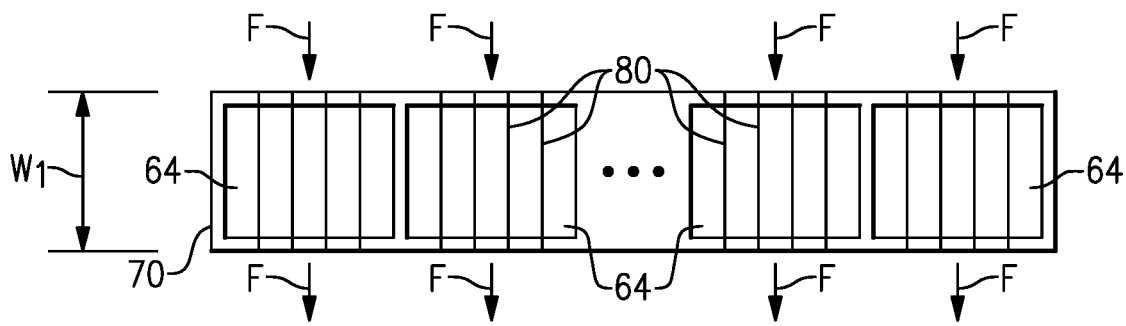
FIG. 7 schematically illustrates a plurality of channels extending in a direction parallel to a width of the frame.

While the fluid F flows in a direction parallel to the length $L_1$ of the frame 70 in FIG. 4, the transaxle 60 may be arranged such that the fluid F flows in a direction parallel to the width $W_1$ of the frame 70, as shown in FIG. 7. The arrangement of FIG. 7 may include any one of the channel arrangements discussed above relative to FIGS. 6A-6C. The channels 80 are shown in FIG. 7, for reference. As with FIG. 5, the channels 80 extend in a direction parallel to the flow of the fluid F.

Figure 8:
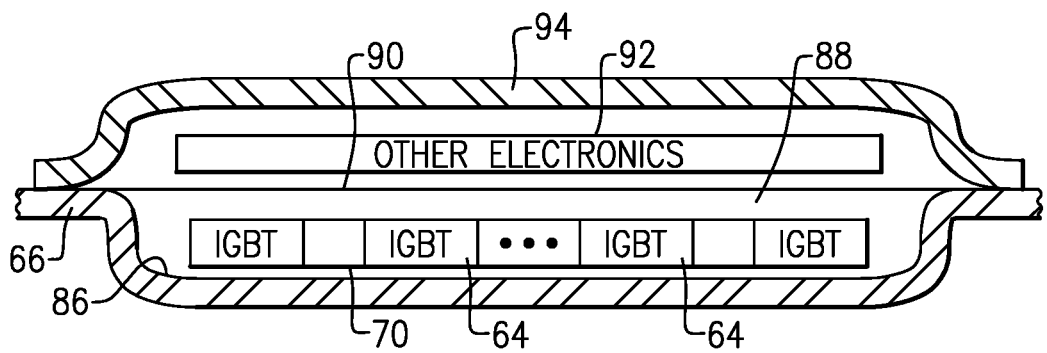
FIG. 8 illustrates another example arrangement in which the IGBTs are mounted on an outer surface of an outer wall of the transaxle.

While in the above embodiments the semiconductor devices are mounted inside the transaxle 60, this disclosure extends to arrangements in which the semiconductor devices are mounted outside the transaxle 60. One such arrangement is shown in FIG. 8. In FIG. 8, the frame 70 is mounted to an outer surface 86 of the outer wall 66 of the transaxle 60, as are the IGBTs 64. The frame 70 and/or the IGBTs 64 may be directly mounted to the outer wall 66 in one example. The outer wall 66 may include a depression to receive the frame 70 and IGBTs 64, as shown, but a depression is not required. Further, while a frame 70 is shown, it should be understood that the IGBTs 64 may be directly mounted to the outer wall 66 without a separate frame 70.

With continued reference to FIG. 8, the IGBTs 64 may be cooled indirectly by fluid F that flows within the transaxle 60. In order to increase heat transfer, the outer wall 66 may include fins projecting inwardly, toward the interior of the transaxle 60. Alternatively or in addition, fluid F may be routed from the source 68 to a space 88 between the outer wall 66 and a separator 90 before it enters the transaxle 60, for example. The IGBTs 64 (or other semiconductor devices) of the FIG. 8 embodiment are cooled by indirect exposure to the fluid that is flowing within the transaxle 60, or by direct exposure to fluid which ultimately flows into the transaxle 60, or both.

In the FIG. 8 embodiment, the fluid F may flow within the space 88 in a manner similar to the way the fluid F flows in the above-discussed embodiments. Further, a separator 90 is not required in all examples, but may be useful in separating the IGBTs 64 and the fluid F from other electronic components 92, which may reside within a cover 94 attached to the outer wall 66. The separator 90 and cover 94 may be sealingly connected to the outer wall 66, such as by welding, for example.

It should be understood that terms such as "about," "substantially," and "generally" are not intended to be boundaryless terms, and should be interpreted consistent with the way one skilled in the art would interpret those terms.

Although the different examples have the specific components shown in the illustrations, embodiments of this disclosure are not limited to those particular combinations. It is possible to use some of the components or features from one of the examples in combination with features or components from another one of the examples. In addition, the various figures accompanying this disclosure are not necessarily to scale, and some features may be exaggerated or minimized to show certain details of a particular component or arrangement.

One of ordinary skill in this art would understand that the above-described embodiments are exemplary and non-limiting. That is, modifications of this disclosure would come within the scope of the claims. Accordingly, the following claims should be studied to determine their true scope and content.

The invention claimed is:

1. A motor vehicle, comprising:
   a transaxle, wherein the transaxle is a mechanical component combining the functionality of at least two of a transmission, axle, and differential into one integrated assembly;
   a plurality of semiconductor devices mounted adjacent the transaxle; and
   a source of cooling fluid, wherein the semiconductor devices are arranged so as to be exposed to fluid from the source that flows into the transaxle.

2. The motor vehicle as recited in claim 1, wherein the semiconductor devices are one of insulated-gate bipolar transistors (IGBTs) and MOSFETs.

3. The motor vehicle as recited in claim 1, wherein the semiconductor devices are mounted on an outer side of an outer wall of the transaxle and are either directly exposed to fluid from the source that ultimately flows into the transaxle or are indirectly exposed to the fluid.

4. The motor vehicle as recited in claim 1, wherein the semiconductor devices are arranged within the transaxle and are directly exposed to fluid from the source that flows into the transaxle.

5. The motor vehicle as recited in claim 4, wherein:
   the transaxle includes an outer wall; and
   the semiconductor devices are supported by a frame having a length substantially parallel to the outer wall.

6. The motor vehicle as recited in claim 5, wherein the semiconductor devices are spaced-apart from the outer wall such that fluid is allowed to flow between the semiconductor devices and the outer wall.

7. The motor vehicle as recited in claim 6, wherein the semiconductor devices are spaced-apart from one another such that fluid is allowed to flow between the semiconductor devices.

8. A motor vehicle, comprising:
   a transaxle;
   a plurality of semiconductor devices mounted adjacent the transaxle;
   a source of cooling fluid;
   wherein the semiconductor devices are arranged within the transaxle and are directly exposed to fluid from the source that flows into the transaxle;
   wherein the transaxle includes an outer wall;
   wherein the semiconductor devices are supported by a frame having a length substantially parallel to the outer wall; and
   wherein the transaxle is configured to direct fluid to flow either (1) along an entirety of the length of the frame in a direction substantially parallel to the length of the frame or (2) along an entirety of a width of the frame in a direction substantially parallel to the width of the frame.

9. The motor vehicle as recited in claim 1, wherein the source includes a transmission fluid cooler.

10. The motor vehicle as recited in claim 9, wherein the fluid is automatic transmission fluid (ATF).

11. The motor vehicle as recited in claim 1, further comprising:
    an inverter configured to change direct current (DC) to alternating current (AC), wherein the inverter includes the semiconductor devices,
    wherein the vehicle is an electrified vehicle including a battery pack and a motor, and
    wherein the inverter is electrically coupled between the battery pack and the motor.

12. A method, comprising:
    cooling semiconductor devices mounted adjacent a transaxle by exposing the semiconductor devices to cooling fluid of the transaxle, wherein the transaxle is a mechanical component combining the functionality of at least two of a transmission, axle, and differential into one integrated assembly.

13. The method as recited in claim 12, wherein:
    the semiconductor devices are mounted to a frame such that the semiconductor devices are spaced-apart from one another, and
    the cooling step includes directing cooling fluid between the semiconductor devices.

14. The method as recited in claim 13, wherein the semiconductor devices are mounted to a frame, and the cooling step includes directing cooling fluid over the semiconductor devices either (1) along an entirety of a length of the frame in a direction substantially parallel to the length of the frame or (2) along an entirety of a width of the frame in a direction substantially parallel to the width of the frame.

15. The method as recited in claim 14, wherein the cooling step includes directing the cooling fluid such that the cooling fluid flows over the semiconductor devices substantially in only one direction.

* * * * *